United States Patent
Benisty et al.

(10) Patent No.: US 11,137,819 B2
(45) Date of Patent: Oct. 5, 2021

(54) PHY CALIBRATION FOR ACTIVE-IDLE POWER REDUCTION

(71) Applicant: Western Digital Technologies, Inc., San Jose, CA (US)

(72) Inventors: Shay Benisty, Beer Sheva (IL); Gennady Burdo, Kfar Vradim (IL); Tal Sharifie, Lehavim (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 147 days.

(21) Appl. No.: 16/459,194

(22) Filed: Jul. 1, 2019

(65) Prior Publication Data

US 2021/0004074 A1    Jan. 7, 2021

(51) Int. Cl.
*G06F 1/3234* (2019.01)
*G11C 11/4074* (2006.01)
*G06F 1/3296* (2019.01)

(52) U.S. Cl.
CPC .......... *G06F 1/3278* (2013.01); *G06F 1/3296* (2013.01); *G11C 11/4074* (2013.01)

(58) Field of Classification Search
CPC . G06F 1/3278; G06F 1/3296; G11C 11/4074; G11C 1/3278; G11C 1/3296
See application file for complete search history.

(56) References Cited

U.S. PATENT DOCUMENTS

| | | | |
|---|---|---|---|
| 7,277,333 B2 | 10/2007 | Schaefer | |
| 7,659,747 B2* | 2/2010 | Shiraishi | H03K 19/00384 326/83 |
| 8,271,811 B2 | 9/2012 | Sinykin et al. | |
| 8,738,952 B1 | 5/2014 | Lachwani et al. | |
| 9,009,510 B2 | 4/2015 | Tan | |
| 9,122,481 B2 | 9/2015 | Unnikrishnan et al. | |
| 9,231,655 B2 | 1/2016 | Tam et al. | |
| 9,298,243 B2 | 3/2016 | Jain et al. | |
| 2012/0113732 A1* | 5/2012 | Sohn | G11C 7/1057 365/191 |
| 2012/0183021 A1* | 7/2012 | Watanabe | H04L 1/0002 375/219 |
| 2012/0257520 A1* | 10/2012 | Li | H04W 52/028 370/252 |
| 2012/0269070 A1* | 10/2012 | Bobrek | H04L 12/12 370/241 |
| 2014/0281600 A1* | 9/2014 | Wells | G06F 3/0634 713/320 |
| 2015/0146768 A1* | 5/2015 | Bulzacchelli | H04L 25/03006 375/232 |
| 2015/0163045 A1* | 6/2015 | Chang | H04L 12/1881 370/296 |
| 2015/0370305 A1* | 12/2015 | Wietfeldt | H04L 25/026 713/320 |
| 2017/0075409 A1* | 3/2017 | Woodruff | G06F 1/3209 |

(Continued)

*Primary Examiner* — Vincent H Tran
(74) *Attorney, Agent, or Firm* — Patterson & Sheridan LLP; Steven H. Versteeg (57) ABSTRACT

A method and apparatus configured to reduce power consumption of a physical (PHY) interface of a digital memory device. In some configurations, the PHY interface is configured to modulate electrical characteristics of a transmitter and/or receiver on the PHY interface according to an idle state of one or more of the digital memory device or a host computing system.

20 Claims, 4 Drawing Sheets

(56) References Cited

U.S. PATENT DOCUMENTS

| | | | |
|---|---|---|---|
| 2017/0085400 A1* | 3/2017 | Berke | H04L 25/03057 |
| 2018/0011528 A1* | 1/2018 | Srivastava | G06F 9/4418 |
| 2020/0128207 A1* | 4/2020 | Masuda | H04N 5/38 |
| 2020/0409444 A1* | 12/2020 | Delshadpour | H04L 25/03878 |

* cited by examiner

PHY CALIBRATION FOR ACTIVE-IDLE POWER REDUCTION

BACKGROUND OF THE DISCLOSURE

Field of the Disclosure

Embodiments of the present disclosure generally relate to systems and methods for reducing power consumption of the physical (PHY) layer of a digital storage device.

Description of the Related Art

High performance serial-based interconnect or link technologies such as Peripheral Component Interconnect (PCI) Express (PCIe) links based on the PCI Express Specification Base Specification are being adopted in greater numbers of systems. PCIe links are point-to-point serial interconnects with N differential pairs intended for data transmission in each direction. However, as data transfer rates have continued to increase, the link (e.g., the physical (PHY) interface of a serial interconnect) has become the highest power consuming component of the circuits they reside on.

In the PCIe Specification, various power saving states are provided for the link. Specifically, the specification describes the presence of link states. For example, the L0, L1, L2, and L3 link states. The L0 state corresponds to link "on" and the L2 and L3 states correspond to link "off" (with the difference being that auxiliary power is present in the L2 state). The L0 state may be characterized as an "active-idle" state when there are no activities on a device or link. Otherwise, the L0 state may be characterized as a fully active state. Accordingly, the active-idle state provides for a standby state that the link can rapidly recover from (i.e., no wake-up time), whereas the L1 state corresponds to a low-power standby state where no data is being transferred so portions of the PCIe can be turned off. While L1 uses relatively less power than L0, recovery time of L1 is relatively longer.

However, peripheral systems may prevent the link from entering into a low power state. For example, other devices may remain active while despite no data being transferred across the link. Moreover, low power states require longer time for the link to recover.

Thus, as the demand for digital storage solutions continue to increase, what is needed are new ways to reduce power consumption of the devices to not only to meet the growing demand, but to advance and enhance the user experience.

SUMMARY OF THE DISCLOSURE

A method and apparatus configured to reduce power consumption of a physical (PHY) interface of a digital memory device. In some configurations, the PHY interface is configured to modulate electrical characteristics of a transmitter and/or receiver on the PHY interface according to an idle state of one or more of the digital memory device or a host computing system.

In one embodiment, the disclosure relates to a device comprising a controller and a physical (PHY) interface configured to communicate data between the device and a host computing system. In some examples, the PHY interface includes a receiver configured receive data from the host computing system, a transmitter configured to transmit data to the host computing system, and a calibration circuit coupled to the receiver and the transmitter. In some examples, the calibration circuit is configured to detect an idle state of one or more of the controller or the host computing system, and adjust a first operational parameter of the transmitter and a second operational parameter of the receiver in response to detecting the idle state, wherein adjusting the first operation parameter and the second operational parameter is configured to reduce power consumption of the PHY interface.

In another embodiment, the disclosure relates to a device, comprising a controller and a physical (PHY) interface configured to communicate data between the device and a host computing system. In some examples, the PHY interface includes a receiver configured receive data from the host computing system, a transmitter configured to transmit data to the host computing system, and a calibration circuit coupled to the receiver and the transmitter. In some examples, the calibration circuit is configured to detect an active state of one or more of the controller or the host computing system, and restore a first operational parameter of the transmitter and a second operational parameter of the receiver in response to detecting the active state, wherein restoring the first operation parameter and the second operational parameter is configured to restore the PHY interface from a low power state to active state.

In another embodiment, the disclosure relates to an apparatus comprising a means controlling access to data stored on a digital storage medium, and a means for communicating data between the apparatus and a host computing system. In some examples, the means for communicating includes a means for receiving data from the host computing system, a means for transmitting data to the host computing system, and a means for calibrating the means for receiving and the means for transmitting. In some examples, the means for calibrating comprises a means for detecting change of a power state of one or more of the means for controlling or the host computing system, and a means for adjusting a first operational parameter of the means for transmitting and a second operational parameter of the means for receiving in response to detecting the change, wherein adjusting the first operation parameter and the second operational parameter is configured to modulate power consumption of the means for communicating.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Overview

The present disclosure generally describes methods and apparatus configured to reduce power consumption of a physical (PHY) interface of a digital memory device. In some configurations, the PHY interface is configured to modulate electrical characteristics of a transmitter and/or receiver on the PHY interface according to an idle state of one or more of the digital memory device or a host computing system.

Aspects of the present disclosure provide various apparatus, devices, systems and methods for controlling power usage within solid state drives (SSDs) or other non-volatile memory (NVM) storage systems. Examples herein relate to NVM systems configured for use with the NVM Express (NVMe) protocol, wherein a data storage controller (e.g., a device controller) is configured to control access to data stored on an NVM system, such as a NAND using NVMe protocols. However, aspects of the techniques described herein are also applicable to other data storage systems or protocols.

As noted in the Background of the Disclosure section above, power management can be a significant issue within storage devices, particularly with the PHY interface. For example, during "Active-idle" where the storage device is in a full power state but there are no pending tasks in the controller of the storage device, the PHY interface may consume more power than any other component in the storage device. One approach to reducing power consumption during idle states is to configure calibration hardware of the PHY interface of the storage device to modulate power consumption of PHY interface components during idle states.

In one example, the calibration hardware is configured to receive internal and external requests for initiating and exiting an active-idle state. The internal requests may come from the device controller, while the external requests come from a host computing device. When entering the active-idle state, the calibration hardware adjusts parameters of a transmitter and receiver of the PHY to operate in a reduced power mode while maintaining the ability to receive packets. Conversely, when exiting the active-idle state, the calibration hardware will restore the parameters of the transmitter and receiver to operate in normal mode.

Exemplary PHY Interface Embodiments

Figure 1:
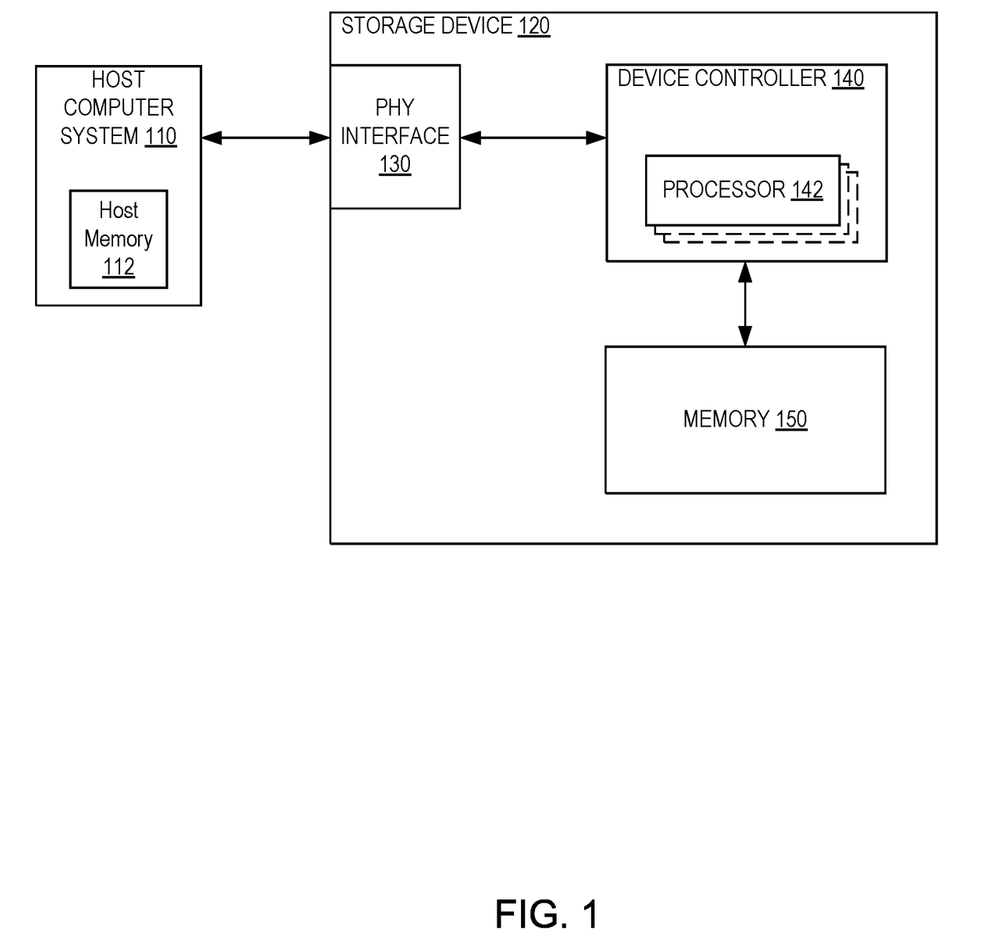
FIG. 1 is a block diagram of a memory device communicatively coupled to a host computing system, in accordance with certain aspects of the disclosure.

FIG. 1 is a block diagram illustrating an example storage device 120, such as a solid state drive (SSD), communicatively coupled to a host computing system 110. The storage device 120 includes a device controller 140 coupled to a physical (PHY) interface 130 and a memory 150. Storage device 120 may have any manner of data stored upon the memory 150 to enable efficient operation of the host 110, or for future use by a user.

The memory 150 may include may include a non-volatile memory (NVM) storage unit configured to store data. In some configurations, the NVM may include flash memory. Flash memory stores information in an array of floating gate transistors, called "cells", and can be electrically erased and reprogrammed in blocks. In some examples, memory 150 may consist of one of more dies or planes of NAND flash memory, electrically programmable read only memories (EPROM), electrically erasable programmable read only memories (EEPROM), and/or other solid-state memories. In some examples, the memory 150 may include storage class memory such as resistive random access memory (RRAM or ReRAM), phase change memory (PCM), magneto-resistive random access memory (MRAM) such as spin transfer torque (STT) MRAM, three dimensional cross point (3D XPoint) memory, and/or other suitable non-volatile memory. The 3D XPoint memory can be a non-volatile memory technology in which bit storage is based on a change of bulk resistance, in conjunction with a stackable cross-gridded data access array.

Storage device 120 may be an internal storage drive, such as a notebook hard drive or a desktop hard drive. Storage device 120 may be a removable mass storage device, such as, but not limited to, a handheld, removable memory device, such as a memory card (e.g., a secure digital (SD) card, a micro secure digital (micro-SD) card, or a multimedia card (MMC)) or a universal serial bus (USB) device. Storage device 120 may take the form of an embedded mass storage device, such as an eSD/eMMC embedded flash drive, embedded in host 110. Storage device 120 may also be any other type of internal storage device, removable storage device, embedded storage device, external storage device, or network storage device.

Host 110 may include a wide range of devices, such as computer servers, network attached storage (NAS) units, desktop computers, notebook (i.e., laptop) computers, tablet computers (i.e., "smart" pad), set-top boxes, telephone handsets (i.e., "smart" phones), televisions, cameras, display devices, digital media players, video gaming consoles, video streaming devices, and automotive applications (i.e., mapping, autonomous driving). In certain embodiments, host 110 includes any device having a processing unit or any form of hardware capable of processing data, including a general purpose processing unit, dedicated hardware (such as an application specific integrated circuit (ASIC)), configurable hardware such as a field programmable gate array (FPGA), or any other form of processing unit configured by software instructions, microcode, or firmware.

Storage device 120 includes physical (PHY) interface components 130, for ingress of communications from host 110 to storage device 120 and egress of communications from storage device 120 to host 110. A link between storage device 120 and host 110 may include any appropriate link, such as a peripheral component interconnect express (PCIe)

link. PCIe link supports full duplex communication between storage device 120 and host 110 via dedicated unidirectional serial point-to-point connections, or "lanes." PCIe link can include one to thirty-two lanes, depending on the number of available PHYs 130 between storage device 120 and host 110.

Communications between storage device 120 and host 110 may operate under a communication hardware protocol, such as a PCIe serial communication protocol or other suitable communication hardware protocols. Other suitable communication hardware protocols include ethernet, serial attached SCSI (SAS), serial AT attachment (SATA), any protocol related to remote direct memory access (RDMA) such as Infiniband, iWARP, or RDMA over Converged Ethernet (RoCE), and other suitable serial communication protocols. Storage device 120 may also be connected to host 110 through a switch or a bridge.

Storage device 120 includes controller 140 which manages operations of storage device 120, such as writes to, and reads from, memory 150. Controller 140 includes one or more processors 142, which may be multi-core processors. Processor 142 handles the components of storage device 120 through firmware code.

Controller 140 may operate under NVM Express (NVMe) protocol, but other protocols are applicable. NVMe protocol is a communications interface/protocol developed for SSDs to operate over a host and storage device linked over the PCIe interface (e.g., PHY 130). NVMe protocol provides a command submission queue and command completion queue for access of data stored in storage device 120 by host 110. Storage device 120 may fetch, receive, or read host 110 commands from a command submission queue of host queues stored in host memory 112.

Controller 140 executes computer-readable program code (e.g., software and/or firmware) executable instructions (herein referred to as "instructions"). The instructions may be executed by various components of controller 140, such as processor 142, logic gates, switches, application specific integrated circuits (ASICs), programmable logic controllers, embedded microcontrollers, and other components of controller 140.

The instructions are stored in a non-transitory computer readable storage medium. In some embodiments, the instructions are stored in a non-transitory computer readable storage medium of storage device 120, such as in memory 150 or in another memory unit (e.g., read-only) on or off the storage device 120. The controller 140 is configured with hardware and instructions to perform the various functions described herein and shown in the figures.

Figure 2:
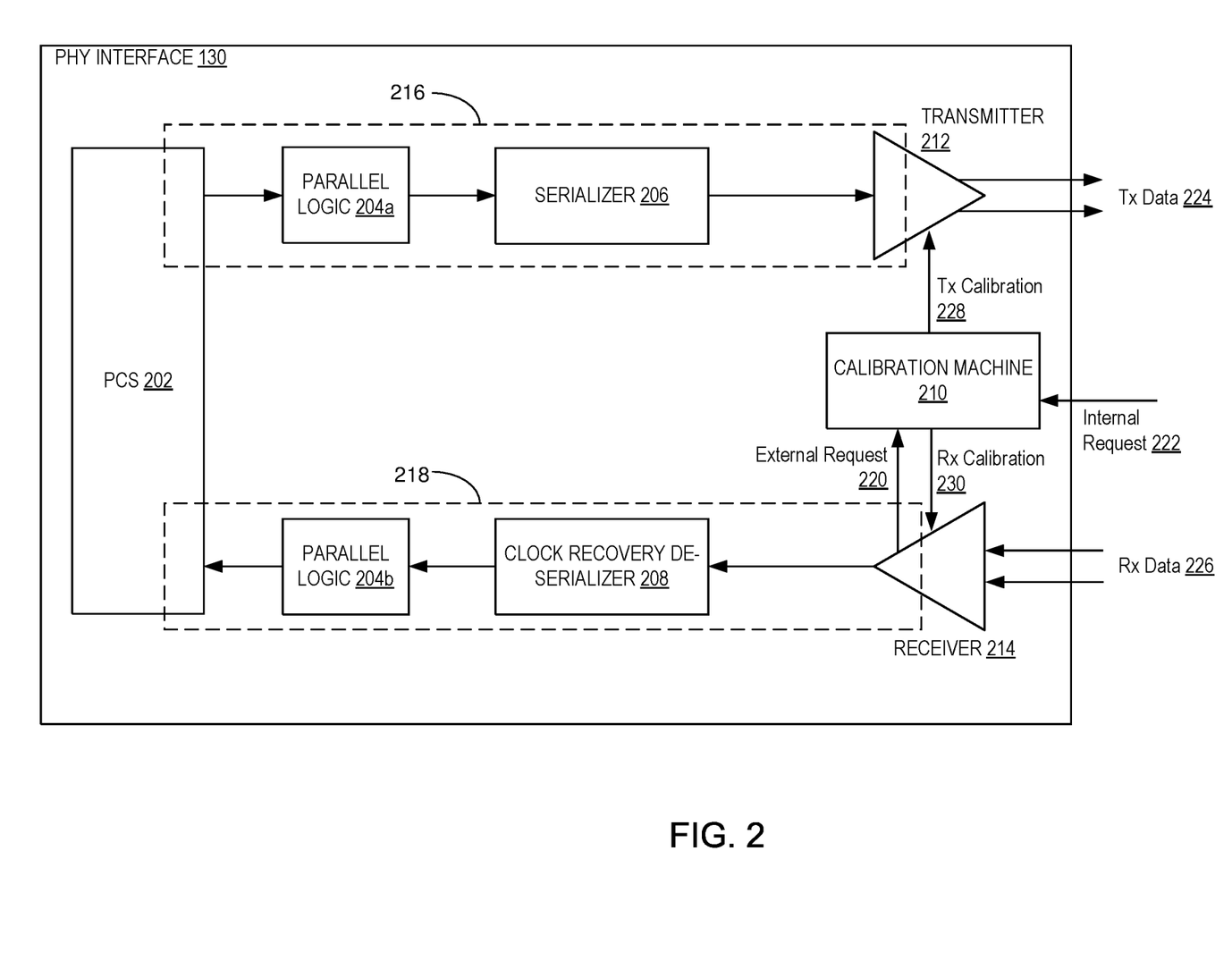
FIG. 2 is a block diagram illustrating a logical representation of the communication organization of a physical (PHY) interface of the memory device of FIG. 1, in accordance with certain aspects of the disclosure.

FIG. 2 is a block diagram illustrating an example PHY interface 130 of the storage device 120 of FIG. 1. Generally, PHY interface 130 may implement any suitable industry-standard protocol (PCIe, SAS, SATA, etc.) to ensure both logical and electrical interoperability between storage device 120 and one or more hosts 110. PHY interface 130 is a mix of hardware (e.g., buffers, drivers, etc.) and firmware (e.g., command decoding performed by the embedded processor 142 which decodes host 110 I/O commands and handles the data flow between the storage device 120 and host 110.

Generally, the PHY interface 130 can be conceptually divided into a physical sub-block and a logical sub-block. The physical sub-block includes a physical media attachment (PMA) layer, and the logical sub-block includes a media access control (MAC) layer and a physical coding sublayer (PCS) 202. The PCS 202 provides an interface between the MAC and PMA layers, and is configured to perform coding and decoding of data transmitted between the PMA layer and MAC layer. As shown in the FIG. 2, the physical sub-block may include the PCS 202 and all circuitry for PHY interface 130 operation, including a transmission path 216 comprising a parallel logic circuit 204a, a serializer circuit 206, and a transmitter 212. A PCS 202 receiving path 218 includes parallel logic circuit 204b, clock recovery de-serializer 208, and a receiver 214. In communication with the receiver 214 and the transmitter 212 is a calibration machine 210.

In some configurations, the transmission path 216 is configured to communicate data from the PCS 202 via the parallel logic 204a to the serializer 206. The serializer 206 operates by serializing data communicated via the parallel logic 204a to a serial bit stream communicated to the transmitter 212, which transmits the Tx data 224 out in accordance with PCIe protocol. Similarly, the receive path 218 is configured to receive Rx data 226 (e.g., a serial bit stream), by the receiver 214, and communicate the serial bit stream to the de-serializer 208. The de-serializer 208 operates by converting the serial bit stream into data for communication on the parallel logic 204b.

The calibration machine 210 is configured to receive internal requests 222 and external requests 220 for initiating and exiting an active-idle state of the PHY interface 130. In some examples, the internal requests 222 are generated by the device controller 140, memory 150, or other component of the storage device, while external requests 220 may be generated by the host 110. In some configurations, an internal request 222 to exit the active-idle state may include a request from the device controller 140 to transmit data to the host 110. In other configurations, the internal request 222 may include one or more data bits configured to indicate a request to exit or initiate an active-idle state. Similarly, an external request 220 to exit the active-idle state may include a notification triggered by the receiver 214 in response to detecting a packet being transmitted by the host 110 active-idle. In some configurations, the calibration machine 210 may detect an active-idle state of one or more of the host 110 or the device controller 140, and initiate an active-idle state of the PHY interface 130 in response to the detection. For example, the calibration machine 210 may determine that there is no activity (e.g., pending I/O commands, active communications, etc.) at the host 110, and no background operations (e.g., garbage collection, etc.) at the device controller 140.

In some configurations, the calibration machine 210 adjusts electrical parameters of the transmitter 212 and the receiver 214 logic using Tx calibration 228 commands and Rx calibration 230 commands, respectively. For example, when entering the active-idle state, the calibration machine 210 adjusts one or more of the transmitter 212 and the receiver 214 to operate in a reduced power mode, while still being able to transmit and receive packets. In the reduced power mode, the bit error rate (BER) may increase, but the transmitter 212 and the receiver 214 are still working to a degree that allows for error recovery (i.e., there may be more errors, but transmitter 212 and receiver 214 function can recover quickly). Conversely, when exiting the active-idle state, the calibration machine 210 will restore the parameters of the transmitter 212 and receiver 214 to operate in a normal power mode.

In some configurations, the calibration machine 210 adjusts a voltage swing of the transmitter 212. For example, upon initiation of an active-idle state, the calibration machine 210 may reduce the voltage of swings at the transmitter 212 during operation of the PHY 130. Depending on the circuit, transmitter 212 swing specifications are typically determined through system simulations and are set high enough to meet target frequency and bit error rate (BER) objectives under worst case platform and system parameters due to operational, environmental, and/or implementation deviations. Accordingly, swing specification can result in high usage and inefficient power usage in many cases, as higher swing levels (and thus higher currents) than are needed are generated. In some examples, upon exiting an active-idle state, the calibration machine 210 may restore the default swing specifications at the transmitter 212 during operation of the PHY 130.

In some configurations, the calibration machine 210 adjusts (e.g., enables or disables) de-emphasis at transmitter 212. De-emphasis is a technique in which transmitter 212 modifies the amplitude signal for various sequences of multiple identical bits so that the signal, as received, is free of inter symbol interference (ISI). Essentially, the transmitter pre-compensates for the ISI that is introduced as the signal traverses a link. In some examples, upon initiation of the active-idle state, the calibration machine 210 may disable de-emphasis at the transmitter 212 during operation of the PHY 130 to reduce power consumption. Similarly, upon exiting the active-idle state, the calibration machine 210 may restore or enable de-emphasis at the transmitter 212.

In some configurations, the calibration machine 210 adjusts a current used to power an analog-front-end (AFE) of the receiver 214. In some examples, the receiver 214 may include analog signal conditioning circuitry, including analog amplifiers, filters, and sometimes application-specific integrated circuits (ASICs) configured provide a receiver interface to a variety of circuits (e.g., microcontrollers, processors, etc.) and handle a variety of signals. However, in an active-idle state, the power required to power the AFE can be conserved without eliminating the effectivity of the receiver 214. Thus, in some examples, upon initiation of the active-idle state, the calibration machine 210 may reduce or cut off the current powering the AFE of the receiver 214 during operation of the PHY 130 to reduce power consumption. Similarly, upon exiting the active-idle state, the calibration machine 210 may restore the current powering the AFE of the receiver 214.

In some configurations, the calibration machine 210 adjusts decision feedback equalization (DFE) implemented at the receiver 214. In some examples, upon initiation of the active-idle state, the calibration machine 210 may disable the DFE, or alternatively, reduce the number of taps in the DFE. Conversely, upon exiting the active-idle state, the calibration machine 210 may enable the DFE or restore the number of taps utilized by the DFE.

Thus, in some configurations, the calibration machine 210 adjusts one or more parameters of the transmitter 212 (e.g., transmitter swing, de-emphasis) and the receiver 214 (e.g., receiver AFE, receiver DFE) when initiating and/or exiting an active-idle state. By adjusting these parameters of the PHY 130, power usage is reduced during an idle state of one or more of the components of the storage device 120 and/or the host 110.

Figure 3:
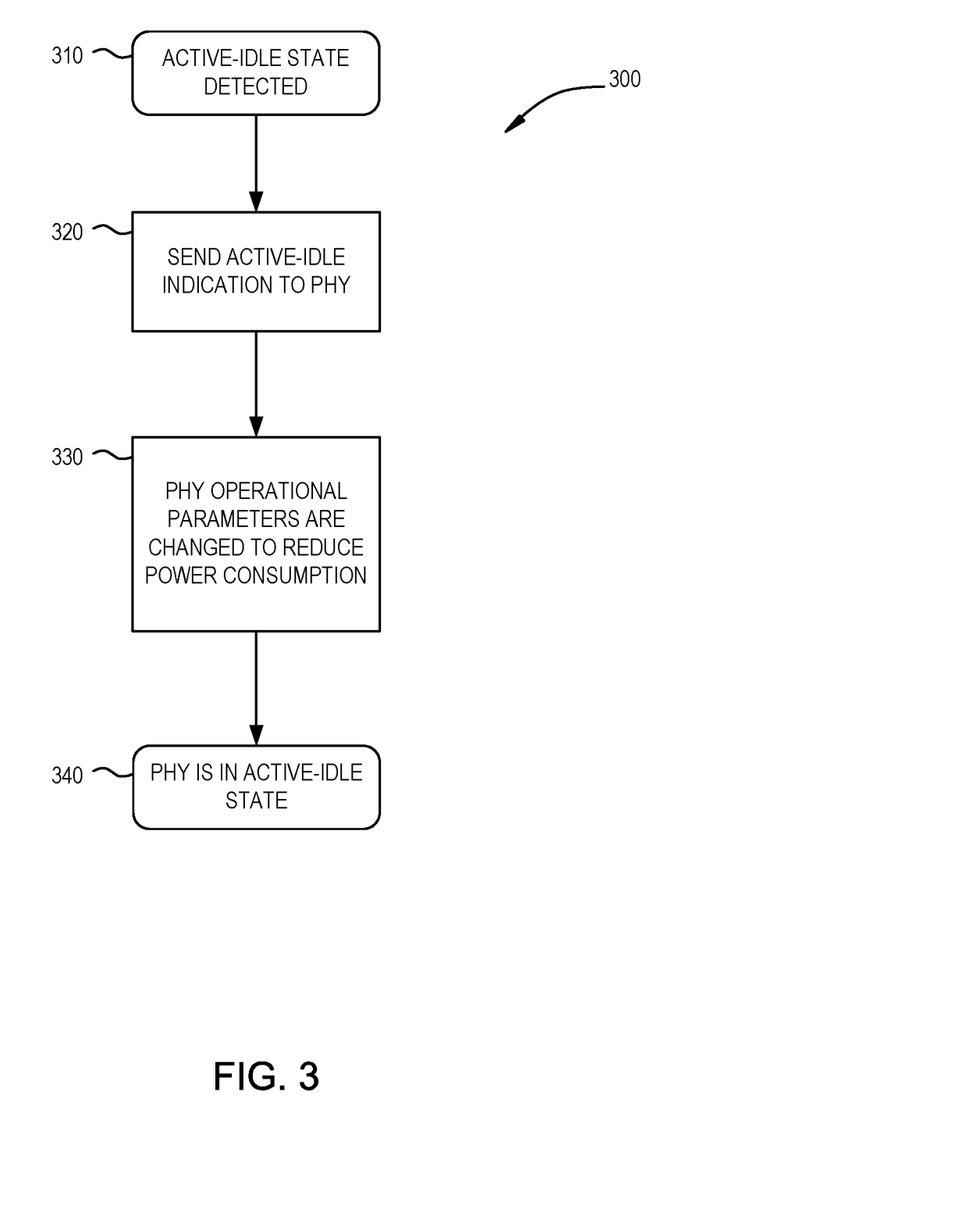
FIG. 3 is a flow diagram illustrating an exemplary process for putting the PHY interface of FIG. 2 into an idle state, in accordance with certain aspects of the disclosure.

FIG. 3 is a flow diagram illustrating an exemplary process 300 for initiating an active-idle state at the PHY 130. The process 300 may be performed, for example, by a one or more components of storage device 120 (e.g., such as device controller 140 of FIG. 1). The process 300 may be implemented as firmware and/or software components stored on a memory that are executed and run on one or more processors (e.g., processor 142 of FIG. 1).

At block 310, the storage device 120 detects an active-idle state of one or more components of the storage device 120 and/or the host 110. For example, the device controller 140 detects the active-idle state. In some examples, the calibration machine 210 detects the active-idle state of one or more of the storage device 120 or the host 110.

At block 320, the device controller 140 communicates a message to the PHY 130 instructing it to enter an active-idle state. In some configurations, the message may be communicated from the host 110 to the calibration machine 210. It should also be noted that in some configurations, the calibration machine 210 may detect an active-idle state of one or more of the storage device 120 or the host 110, and may automatically initiate the active-idle state of the PHY 130. In such a configuration, block 320 is optional.

At block 330, the calibration machine 210 adjusts electrical parameters of the PHY 130 to reduce power consumption. For example, the calibration machine 210 may disable or reduce electrical characteristics of one or more parameters of the transmitter 212 (e.g., transmitter swing, de-emphasis) and the receiver 214 (e.g., receiver AFE, receiver DFE) when initiating the active-idle state.

At block 340, the PHY 130 is in an active-idle state.

Figure 4:
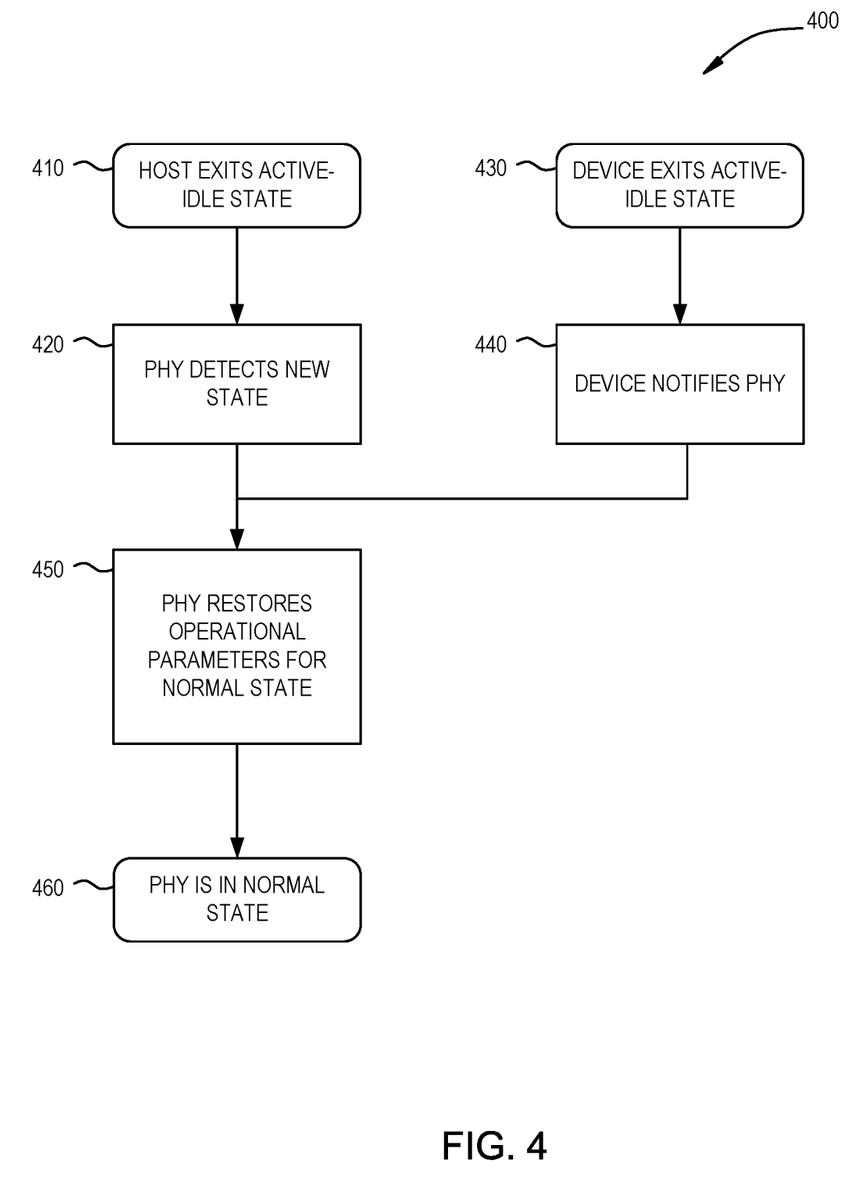
FIG. 4 is a flow diagram illustrating an exemplary process for putting the PHY interface of FIG. 2 into an active state, in accordance with certain aspects of the disclosure.

FIG. 4 is a flow diagram illustrating an exemplary process 400 for transitioning from an active-idle state to an active state at the PHY 130. The process 400 may be performed, for example, by a one or more components of storage device 120 (e.g., such as device controller 140 of FIG. 1). The process 400 may be implemented as firmware and/or software components stored on a memory that are executed and run on one or more processors (e.g., processor 142 of FIG. 1).

One example scenario that prompts the PHY 130 to initiate a transition from the active-idle state to the active state is shown in blocks 410 and 420. In this example, at block 410, the host 110 becomes active, or exits its previously idle state. The process 400 then moves on to block 420, where the calibration machine 210 detects that the host 110 has entered into a new state, or has become active.

Another example scenario that prompts the PHY 130 to initiate a transition from the active-idle state to the active state is shown in blocks 430 and 440. In this example, at block 430, the storage device (e.g., device controller 140, memory 150) becomes active, or exits its previously idle state. The process 400 then moves on to block 440, where the device controller 140 notifies the PHY 130 (e.g., the calibration machine 210) that the host 110 has entered into a new state, or has become active.

In another example scenario, the calibration machine 210 may further reduce or disable the electrical characteristics of one or more of the transmitter 212 or the receiver 214 when receiving packets from either of the device controller 140 or the host 110. In one example, the PHY 130 may begin receiving packets from the host 110 while in an active-idle state. In this example, the calibration machine 210 may reduce the electrical characteristics of the receiver 214 while it is receiving the packets in order to require the device controller 140 to request a re-transmission of the packets from the host 110. In this example, the re-transmission request provides additional time for the PHY 130 to become fully active (i.e., for a normal operational state to be restored).

At block 450, the calibration machine 210 restores electrical parameters of the PHY 130 to transition from an active-idle state to an active, or normal operation state. The step described at block 450 may be initiated following one or more of either scenario described above. For example, the calibration machine 210 may enable or restore electrical characteristics of one or more parameters of the transmitter 212 (e.g., transmitter swing, de-emphasis) and the receiver 214 (e.g., receiver AFE, receiver DFE).

At block 460, the PHY 130 is in an active, or normal operation state.

In summary, the disclosure relates generally to systems, methods, and apparatus for reducing power usage at a storage device, while maintaining operational fidelity of the device. In particular, certain aspects of the disclosure relate to software and hardware configured to support reduction/disabling of electrical characteristics of a PHY 130 interface during an active-idle state of one or more devices, and restoration of the electrical characteristics when the one or more devices become active. Such features strategically reduce power consumption of digital storage devices (e.g., storage device 120) without affecting operation of the devices.

In one non-limiting embodiment, a device is disclosed, wherein the device includes a controller and a physical (PHY) interface configured to communicate data between the device and a host computing system. In some examples, the PHY interface includes a receiver configured receive data from the host computing system, a transmitter configured to transmit data to the host computing system, and a calibration circuit coupled to the receiver and the transmitter. In some examples, the calibration circuit is configured to detect an idle state of one or more of the controller or the host computing system, and adjust a first operational parameter of the transmitter and a second operational parameter of the receiver in response to detecting the idle state, wherein adjusting the first operation parameter and the second operational parameter is configured to reduce power consumption of the PHY interface.

In one non-limiting embodiment, the controller is further configured to determine whether the host computing system is in an idle state, and wherein the calibration circuit, being configured to detect the idle state of one or more of the controller or the host computing system, is further configured to receive, from the controller, an indication of the idle state of the host computing system.

In one non-limiting embodiment, the first parameter of the transmitter comprises one or more of a voltage of a transmission swing or a de-emphasis function.

In one non-limiting embodiment, adjusting the first parameter comprises reducing the voltage of the transmission swing and disabling the de-emphasis function.

In one non-limiting embodiment, the second parameter of the receiver comprises one or more of a current of an analog front end (AFE) or a decision feedback equalizer (DFE) function.

In one non-limiting embodiment, adjusting the second parameter of the receiver comprises reducing the current of the AFE and disabling the DFE function.

In one non-limiting embodiment, adjusting the second parameter of the receiver comprises reducing a number of taps in the DFE.

In one non-limiting embodiment, the calibration circuit, being configured to detect the idle state, is further configured to receive, from one or more of the controller or the host computing system, a command to enter the PHY interface into a low power state.

In one non-limiting embodiment, the calibration circuit, being configured to adjust the first operational parameter and the second operational parameter, is further configured to adjust the first operational parameter and the second operational parameter to reduce power consumption of the PHY interface in response to the command.

In one non-limiting embodiment, a device is disclosed, wherein the device includes a controller and a physical (PHY) interface configured to communicate data between the device and a host computing system. In some examples, the PHY interface includes a receiver configured receive data from the host computing system, a transmitter configured to transmit data to the host computing system, and a calibration circuit coupled to the receiver and the transmitter. In some examples, the calibration circuit is configured to detect an active state of one or more of the controller or the host computing system, and restore a first operational parameter of the transmitter and a second operational parameter of the receiver in response to detecting the active state, wherein restoring the first operation parameter and the second operational parameter is configured to restore the PHY interface from a low power state to active state.

In one non-limiting embodiment, the calibration circuit, being configured to detect the active state of one or more of the controller or the host computing system, is further configured to receive, via one or more of the controller or the host computing system, a command to end the low power state of the PHY interface.

In one non-limiting embodiment, detecting the active state of one or more of the controller or the host computing system comprises detecting one or more of a pending memory command at the host computing system or an active background operation of the controller.

In one non-limiting embodiment, the calibration circuit, being configured to adjust the first operational parameter and the second operational parameter, is further configured to adjust the first operational parameter and the second operational parameter to increase power consumption of the PHY interface relative to power consumption of the low power state in response to the indication.

In one non-limiting embodiment, the PHY interface is further configured to receive a communication comprising data configured to be transmitted to the controller and adjust one or more of the first operational parameter of the transmitter or the second operational parameter of the receiver in response to receiving the communication, wherein adjusting the first operation parameter and the second operational parameter is configured to reduce power consumption of the PHY interface. In some examples, the controller is configured to terminate the communication in response to the adjustment, and request retransmission of the communication.

In one non-limiting embodiment, the calibration circuit, being configured to adjust the first operational parameter and the second operational parameter, is further configured to re-adjust the first operational parameter and the second operational parameter to increase power consumption of the PHY interface in response to the retransmission request.

In one non-limiting embodiment, an apparatus is disclosed, wherein the apparatus includes a means controlling access to data stored on a digital storage medium, and means for communicating data between the apparatus and a host computing system. In some examples, the means for communicating includes a means for receiving data from the host computing system, a means for transmitting data to the host computing system, and a means for calibrating the means for receiving and the means for transmitting. In some examples, the means for calibrating includes a means for detecting change of a power state of one or more of the means for controlling or the host computing system, and a means for adjusting a first operational parameter of the means for transmitting and a second operational parameter of the means for receiving in response to detecting the change, wherein adjusting the first operation parameter and the second operational parameter is configured to modulate power consumption of the means for communicating.

In one non-limiting embodiment, the first parameter comprises one or more of a voltage of a transmission swing or a de-emphasis function.

In one non-limiting embodiment, adjusting the first parameter comprises reducing the voltage of the transmission swing and disabling the de-emphasis function.

In one non-limiting embodiment, the second parameter comprises one or more of a current of an analog front end (AFE) or a decision feedback equalizer (DFE) function.

In one non-limiting embodiment, adjusting the second parameter comprises reducing the current of the AFE and disabling the DFE function.

While the foregoing is directed to embodiments of the present disclosure, other and further embodiments of the disclosure may be devised without departing from the basic scope thereof, and the scope thereof is determined by the claims that follow.

What is claimed is:

1. A device, comprising:
a controller; and
a physical (PHY) interface configured to communicate data between the device and a host computing system, the PHY interface comprising:
   a receiver configured to receive data from the host computing system;
   a transmitter configured to transmit data to the host computing system; and
   a calibration circuit coupled to the receiver and the transmitter, wherein the calibration circuit is configured to:
      detect an idle state of one or more of the controller or the host computing system;
      adjust a first operational parameter of the transmitter and a second operational parameter of the receiver in response to detecting the idle state, wherein adjusting the first operational parameter and the second operational parameter is configured to reduce power consumption of the PHY interface; and
      while receiving packets from either the controller or the host computing system, reduce the second operational parameter, wherein reducing the second operational parameter causes the controller to request a re-transmission of the packets.

2. The device of claim 1, wherein the first operational parameter of the transmitter comprises one or more of a voltage of a transmission swing or a de-emphasis function.

3. The device of claim 1, wherein the second operational parameter of the receiver comprises one or more of a current of an analog front end (AFE) or a decision feedback equalizer (DFE) function.

4. The device of claim 3, wherein adjusting the second operational parameter of the receiver comprises reducing a number of taps in the DFE.

5. The device of claim 1, wherein the calibration circuit, being configured to detect the idle state, is further configured to receive, from one or more of the controller or the host computing system, a request to enter the PHY interface into a low power state.

6. The device of claim 5, wherein the calibration circuit, being configured to adjust the first operational parameter and the second operational parameter, is further configured to adjust the first operational parameter and the second operational parameter to reduce power consumption of the PHY interface in response to the request.

7. A device, comprising:
a controller; and
a physical (PHY) interface configured to communicate data between the device and a host computing system, the PHY interface comprising:
   a receiver configured to receive data from the host computing system;
   a transmitter configured to transmit data to the host computing system; and
   a calibration circuit coupled to the receiver and the transmitter, wherein the calibration circuit is configured to:
      detect an idle state of one or more of the controller or the host computing system; and
      adjust a first operational parameter of the transmitter and a second operational parameter of the receiver in response to detecting the idle state, wherein:
         adjusting the first operational parameter and the second operational parameter is configured to reduce power consumption of the PHY interface;
         the first operational parameter of the transmitter comprises one or more of a voltage of a transmission swing or a de-emphasis function; and
         adjusting the first operational parameter comprises reducing the voltage of the transmission swing and disabling the de-emphasis function.

8. A device, comprising:
a controller; and
a physical (PHY) interface configured to communicate data between the device and a host computing system, the PHY interface comprising:
   a receiver configured to receive data from the host computing system;
   a transmitter configured to transmit data to the host computing system; and
   a calibration circuit coupled to the receiver and the transmitter, wherein the calibration circuit is configured to:
      detect an idle state of one or more of the controller or the host computing system; and
      adjust a first operational parameter of the transmitter and a second operational parameter of the receiver in response to detecting the idle state, wherein:
         adjusting the first operational parameter and the second operational parameter is configured to reduce power consumption of the PHY interface;
         the second operational parameter of the receiver comprises one or more of a current of an analog front end (AFE) or a decision feedback equalizer (DFE) function; and
         adjusting the second operational parameter of the receiver comprises reducing the current of the AFE and disabling the DFE function.

9. A device, comprising:
a controller; and
a physical (PHY) interface configured to communicate data between the device and a host computing system, the PHY interface comprising:
   a receiver configured to receive data from the host computing system;
   a transmitter configured to transmit data to the host computing system; and a calibration circuit coupled to the receiver and the transmitter, wherein the calibration circuit is configured to:
  detect an active state of one or more of the controller or the host computing system;
  restore a first operational parameter of the transmitter and a second operational parameter of the receiver in response to detecting the active state, wherein restoring the first operational parameter and the second operational parameter is configured to restore the PHY interface from a low power state to an active state; and
  while receiving a plurality of packets from either the controller or the host computing system, reduce the second operational parameter, wherein reducing the second operational parameter causes the controller to request a re-transmission of the plurality packets.

10. The device of claim 9, wherein the calibration circuit, being configured to detect the active state of one or more of the controller or the host computing system, is further configured to receive, via one or more of the controller or the host computing system, a request to end the low power state of the PHY interface.

11. A device, comprising:
a controller; and
a physical (PHY) interface configured to communicate data between the device and a host computing system, the PHY interface comprising:
  a receiver configured to receive data from the host computing system;
  a transmitter configured to transmit data to the host computing system; and
  a calibration circuit coupled to the receiver and the transmitter, wherein the calibration circuit is configured to:
    detect an active state of one or more of the controller or the host computing system, wherein detecting the active state of one or more of the controller or the host computing system comprises detecting one or more of a pending memory command at the host computing system or an active background operation of the controller; and
    restore a first operational parameter of the transmitter and a second operational parameter of the receiver in response to detecting the active state, wherein restoring the first operational parameter and the second operational parameter is configured to restore the PHY interface from a low power state to an active state.

12. A device, comprising:
a controller; and
a physical (PHY) interface configured to communicate data between the device and a host computing system, the PHY interface comprising:
  a receiver configured to receive data from the host computing system;
  a transmitter configured to transmit data to the host computing system; and
  a calibration circuit coupled to the receiver and the transmitter, wherein the calibration circuit is configured to:
    detect an active state of one or more of the controller or the host computing system;
    restore a first operational parameter of the transmitter and a second operational parameter of the receiver in response to detecting the active state, wherein restoring the first operational parameter and the second operational parameter is configured to restore the PHY interface from a low power state to an active state; and
wherein the PHY interface is further configured to:
    receive a communication comprising data configured to be transmitted to the controller; and
    adjust one or more of the first operational parameter of the transmitter or the second operational parameter of the receiver in response to receiving the communication, wherein adjusting the first operation operational parameter and the second operational parameter is configured to reduce power consumption of the PHY interface, wherein the controller is configured to:
      terminate the communication in response to the adjustment; and
      request retransmission of the communication.

13. The device of claim 12, wherein the calibration circuit, being configured to adjust the first operational parameter and the second operational parameter, is further configured to re-adjust the first operational parameter and the second operational parameter to increase power consumption of the PHY interface in response to the retransmission request.

14. An apparatus, comprising:
means for controlling access to data stored on a digital storage medium; and
means for communicating data between the apparatus and a host computing system, comprising:
  means for receiving data from the host computing system;
  means for transmitting data to the host computing system; and
  means for calibrating the means for receiving and the means for transmitting, wherein the means for calibrating comprises:
    means for detecting change of a power state of one or more of the means for controlling or the host computing system;
    means for adjusting a first operational parameter of the means for transmitting and a second operational parameter of the means for receiving in response to detecting the change, wherein adjusting the first operational parameter and the second operational parameter is configured to modulate power consumption of the means for communicating; and
    while receiving a plurality of packets from either the means for controlling access or the host computing system, means for reducing the second operational parameter, wherein the means for reducing the second operational parameter causes the means for controlling access to request a re-transmission of the plurality packets.

15. The apparatus of claim 14, wherein the first operational parameter comprises one or more of a voltage of a transmission swing or a de-emphasis function.

16. The apparatus of claim 15, wherein adjusting the first operational parameter comprises reducing the voltage of the transmission swing and disabling the de-emphasis function.

17. The apparatus of claim 14, wherein the second operational parameter comprises one or more of a current of an analog front end (AFE) or a decision feedback equalizer (DFE) function.

18. The apparatus of claim 17, wherein adjusting the second operational parameter comprises reducing the current of the AFE and disabling the DFE function.

19. The apparatus of claim 14, wherein adjusting the second operational parameter comprises reducing a number of taps in a decision feedback equalizer (DFE).

20. The apparatus of claim 14, further comprising means for receiving an external request for adjusting a first operational parameter of the means for transmitting and a second operational parameter of the means for receiving, wherein the external request is received via the means for receiving.

* * * * *